US006946401B2

(12) United States Patent
Huang et al.

(10) Patent No.: US 6,946,401 B2
(45) Date of Patent: Sep. 20, 2005

(54) PLASMA TREATMENT FOR COPPER OXIDE REDUCTION

(75) Inventors: Judy H. Huang, Los Gatos, CA (US); Christopher Dennis Bencher, Sunnyvale, CA (US); Sudha Rathi, San Jose, CA (US); Christopher S. Ngai, Burlingame, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/655,438

(22) Filed: Sep. 4, 2003

(65) Prior Publication Data

US 2004/0046260 A1 Mar. 11, 2004

Related U.S. Application Data

(63) Continuation of application No. 10/013,182, filed on Dec. 7, 2001, now Pat. No. 6,700,202, which is a division of application No. 09/365,129, filed on Jul. 30, 1999, now Pat. No. 6,355,571, which is a continuation-in-part of application No. 09/193,920, filed on Nov. 17, 1998, now abandoned.

(51) Int. Cl.$^7$ ............................................ H01L 21/302
(52) U.S. Cl. ...................................... 438/706; 438/573
(58) Field of Search ................................. 438/706, 573, 438/675, 680, 597, 676, 685, 656, 694

(56) References Cited

U.S. PATENT DOCUMENTS

| | | | |
|---|---|---|---|
| 4,308,089 A | 12/1981 | Iida et al. ................... 156/643 |
| 4,420,386 A | 12/1983 | White ......................... 204/192 |
| 4,436,761 A | 3/1984 | Hayashi et al. ............... 427/38 |
| 4,980,196 A | 12/1990 | Yasuda et al. ................ 427/38 |
| 4,994,410 A | 2/1991 | Sun et al. ................... 437/192 |
| 5,000,113 A | 3/1991 | Wang et al. ................. 118/723 |
| 5,121,706 A | 6/1992 | Nichols et al. ............. 118/719 |
| 5,135,775 A | 8/1992 | Foller et al. ................. 437/38 |
| 5,232,871 A | 8/1993 | Ho .............................. 437/190 |
| 5,232,872 A | 8/1993 | Ohba ......................... 437/192 |

(Continued)

FOREIGN PATENT DOCUMENTS

| | | | |
|---|---|---|---|
| DE | 195 21 150 | 12/1995 | ......... H01L/23/522 |
| DE | 197 51 785 | 5/1998 | ......... H01L/21/768 |
| DE | 197 02 124 | 7/1998 | ............ B01J/19/08 |
| DE | 197 17 698 | 10/1998 | ............ H05K/3/26 |
| EP | 0 416 400 | 3/1991 | ........... C23C/16/44 |
| EP | 0 630 989 | 12/1994 | ........... C23C/16/44 |
| EP | 0 684 671 | 11/1995 | ........... H01S/3/025 |
| EP | 0 780 485 | 6/1997 | ........... C23C/14/02 |
| EP | 0 849 779 | 6/1998 | ......... H01L/21/306 |
| FR | 2 775 986 | 9/1999 | ............. C23F/1/12 |

(Continued)

OTHER PUBLICATIONS

Darchen, et al, "Electrochemical Investigations of Copper Etching by Cu (NH$_3$)$_4$ Cl$_2$ in Ammoniacal Solutions", Journal of Applied Electrochemistry, 1997, 27 (4), 448–454.

(Continued)

Primary Examiner—Long Pham
(74) Attorney, Agent, or Firm—Moser, Patterson & Sheridan (57) ABSTRACT

The present invention provides an in situ plasma reducing process to reduce oxides or other contaminants, using a compound of nitrogen and hydrogen, typically ammonia, at relatively low temperatures prior to depositing a subsequent layer thereon. The adhesion characteristics of the layers are improved and oxygen presence is reduced compared to the typical physical sputter cleaning process of an oxide layer. This process may be particularly useful for the complex requirements of a dual damascene structure, especially with copper applications.

13 Claims, 6 Drawing Sheets

U.S. PATENT DOCUMENTS

| | | | |
|---|---|---|---|
| 5,288,527 A | 2/1994 | Jousse et al. | 427/579 |
| 5,409,543 A | 4/1995 | Panitz et al. | 134/2 |
| 5,420,044 A | 5/1995 | Kozuka | 437/4 |
| 5,441,768 A | 8/1995 | Law et al. | 427/255.7 |
| 5,451,263 A | 9/1995 | Linn et al. | 134/1.1 |
| 5,458,907 A | 10/1995 | Ishido | 427/96 |
| 5,599,736 A | 2/1997 | Tseng | 437/186 |
| 5,643,834 A | 7/1997 | Harada et al. | 437/210 |
| 5,725,938 A | 3/1998 | Jin et al. | 428/210 |
| 5,726,097 A | 3/1998 | Yanagida | 438/622 |
| 5,736,002 A | 4/1998 | Allen et al. | 156/628.1 |
| 5,780,163 A | 7/1998 | Camilletti et al. | 428/446 |
| 5,801,098 A | 9/1998 | Fiordalice et al. | 438/653 |
| 5,834,371 A | 11/1998 | Ameen et al. | 438/656 |
| 5,843,847 A | 12/1998 | Pu et al. | 438/723 |
| 5,866,213 A | 2/1999 | Foster et al. | 427/573 |
| 5,899,720 A | 5/1999 | Mikagi | 438/303 |
| 5,950,083 A | 9/1999 | Inoue et al. | 438/233 |
| 5,970,378 A | 10/1999 | Shue et al. | 438/656 |
| 5,975,912 A | 11/1999 | Hillman et al. | 437/245 |
| 6,013,574 A | 1/2000 | Hause et al. | 438/622 |
| 6,033,537 A | 3/2000 | Suguro | 204/192.2 |
| 6,071,813 A | 6/2000 | Nogami | 438/687 |
| 6,143,128 A | 11/2000 | Ameen et al. | 156/345 |
| 6,143,640 A | 11/2000 | Cronin et al. | 438/618 |
| 6,172,421 B1 | 1/2001 | Besser et al. | 257/751 |
| 6,174,810 B1 | 1/2001 | Islam et al. | 438/687 |
| 6,251,775 B1 | 6/2001 | Armbrust et al. | 438/644 |
| 6,303,505 B1 | 10/2001 | Ngo et al. | 438/687 |
| 6,319,728 B1 | 11/2001 | Bhan et al. | 436/687 |
| 6,355,571 B1 | 3/2002 | Huang et al. | 438/706 |
| 6,365,527 B1 | 4/2002 | Yang et al. | 438/761 |

FOREIGN PATENT DOCUMENTS

| | | | |
|---|---|---|---|
| GB | 2 155 862 | 10/1985 | C23C/16/44 |
| GB | 2 290 166 | 12/1995 | H01L/21/3213 |
| GB | 2 319 532 | 5/1998 | C23C/14/58 |
| GB | 2 319 533 | 5/1998 | C23C/14/58 |
| JP | 61-009579 | 1/1986 | C23C/22/00 |
| JP | 61-000579 | 6/1986 | |
| JP | 62-158859 | 7/1987 | C23C/14/02 |
| JP | 11-16912 | 5/1989 | G11B/5/39 |
| JP | 04-072724 | 3/1992 | H01L/21/302 |
| JP | 04-273442 | 9/1992 | H01L/21/3205 |
| JP | 06-097111 | 4/1994 | H01L/21/28 |
| JP | 06-204191 | 7/1994 | H01L/21/302 |
| JP | 07-201738 | 8/1995 | H01L/21/205 |
| JP | 07-201749 | 8/1995 | H01L/21/205 |
| JP | 11-016912 | 1/1999 | H01L/21/305 |
| WO | 93/17453 | 9/1993 | H01L/21/306 |

OTHER PUBLICATIONS

Hymes, et al. "Surface Cleaning of Copper by Thermal and Plasma Treatment in Reducing and Inert Ambients", 1 Vac. Sci. Technol. vol. 16, No. 3 May/Jun. 1998; pp. 1107–1109.

Ito, et al, "Direct Thermal Nitridation of Silicon Dioxide Films in Anhydrous Ammonia Gas," J. Electrochem. Soc., vol. 127, No. 9, pp. 2053–2057.

Kanehiro, et al. "Cleaning of copper or copper alloy for dry coating"; Chemical Abstracts, vol. 107, No. 26, p. 83; Dec. 28, 1987.

"Low Temperature Process for Surface Cleaning", Research Disclosure, GB, Industrial Opportunities Ltd. Havant, No. 309, Jan. 1, 1990, p. 82.

Mikagi, et al, Barrier Metal Free Copper Damascene Interconnection Technology Using Atmospheric Copper Reflow and Nitrogen Doping in SiOF Film, 1996 IEEE, IEVM 96, 365–368, pp. 14.5.1–14.5.4.

Research Disclosure XP000099373, "Low Temperature Process for Surface Cleaning", No. 309, p. 82, Jan. 1, 1990.

Sawada, et al., "The reduction of copper oxide thin films with hydrogen plasma generated by an atmospheric–pressure glow discharge," J. Phys. Appl. Phys. 29 (1996), pp. 2539–2544.

Swope, et al, "Improvement of Adhesion Properties of Fluorinated Silica Glass Films by Nitrous Oxide Plasma Treatment," J. Electrochem. Soc., vol. 144, No. 7, Jul. 1997, pp. 2559–2564.

Takeishi, et al, Stabilizing Dielectric Constants of Fluorine–Doped $SiO_2$ Films by $N_2O$–Plasma Annealing, J. Electrochem. Soc., vol. 143, No. 1, Jan. 1996, pp. 381–384.

Takewaki, et al, "A Novel Self–Aligned Surface–Silicide Passivation Technology for Reliability Enhancement in Copper Interconnects", 1995 Symposium on VLSI Technology Digest of Technical Papers, pp. 31–32.

Wong, et al, "Low Pressure Nitrided–Oxide as a Thin Gate Dielectric for MOSEFTI's," vol. 130, No. 5, pp. 1139–1144.

PLASMA TREATMENT FOR COPPER OXIDE REDUCTION

CROSS-REFERENCE TO RELATED APPLICATIONS

This application is a continuation of U.S. patent application Ser. No. 10/013,182, filed Dec. 7, 2001 U.S. Pat. No. 6,700,202, which is a divisional of U.S. patent application Ser. No. 09/365,129, filed Jul. 30, 1999 U.S. Pat. No. 6,355,571, which is a continuation-in-part of U.S. patent application Ser. No. 09/193,920, filed Nov. 17, 1998 now abandoned, all of which are hereby incorporated by reference in their entireties.

BACKGROUND OF THE INVENTION

1. Field of the Invention

The present invention relates generally to the fabrication of integrated circuits on substrates. More particularly, the invention relates to a method of reducing oxides on a substrate prior to depositing a layer thereover in the fabrication process.

2. Background of the Invention

Reliably producing sub-half micron and smaller features is one of the key technologies for the next generation of very large scale integration (VLSI) and ultra large scale integration (ULSI) integrated circuits. However, as the fringes of circuit technology are pressed, the shrinking dimensions of interconnects in VLSI and ULSI technology has placed additional demands on the processing capabilities. The multilevel interconnects that lie at the heart of this technology require careful processing of high aspect ratio features, such as vias and other interconnects. Reliable formation of these interconnects is very important to the VLSI and ULSI success and to the continued effort to increase circuit density and quality of individual substrates and die.

Conventional chemical vapor deposition (CVD) and physical vapor deposition (PVD), and now electroplating, techniques are used to deposit electrically conductive material into the contacts, vias, lines, or other features formed on the substrate. Considerable effort has focused on reliably depositing material in these high aspect ratio, smaller interconnects.

Figure 1:
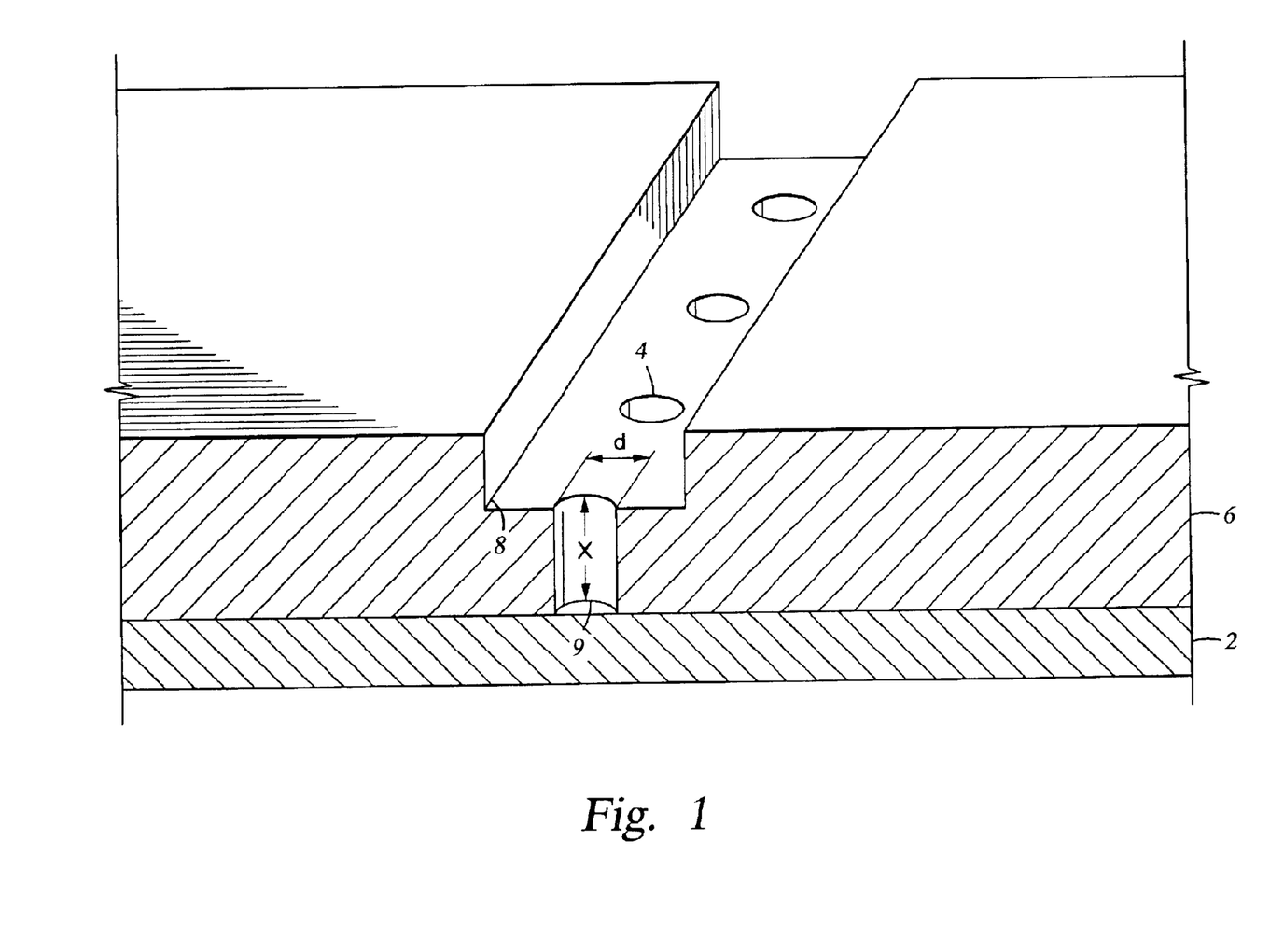
FIG. 1 shows a schematic of a multilevel substrate with interconnects.

One issue that still needs improvement as feature sizes shrink is the reduction of oxides in these very small features. FIG. 1 shows a substrate 2 with a via 4 formed within an electrically insulative or dielectric layer 6. With current technology, the aspect ratio has increased to approximately 5:1 for the height to width ratio, shown in FIG. 1 as x with respect to d. As a result, it is becoming more difficult to properly prepare the surfaces within the small features for subsequent processing, especially in the lower interconnect portions, such as in the interconnect areas 8, 9.

In part, this attention to improved cleaning is due to a desired change in the conductor metal. For example, copper is now being considered as an interconnect material in place of aluminum, because copper has a lower resistivity (1.7 $\mu\Omega$-cm compared to 3.1 $\mu\Omega$-cm for aluminum) and higher current carrying capacity. However, copper is highly susceptible to oxidation. With copper depositions, oxidation is considered a detriment and interferes with adhesion on the adjacent layer, affects conductivity of the copper feature, and reduces the reliability of the overall circuit. Furthermore, present processes utilize oxygen for a variety of reasons in some instances and in other instances, oxygen is a byproduct of the reactions. Thus, even carefully controlled environments may contain oxygen that may oxidize copper or other conductive materials, such as aluminum, to the detriment of the circuit.

Copper has other difficulties. Because copper is difficult to etch in a precise pattern, traditional deposition/etch processes for forming interconnects has become unworkable, and accordingly, a "dual damascene" structure is being used for copper interconnects. In a typical dual damascene structure, the dielectric layer is etched to define both the contacts/vias and the interconnect lines. Metal is then inlaid into the defined pattern and any excess metal is typically removed from the top of the structure in a planarization process, such as CMP. This complex approach increases the importance of obtaining properly cleaned surfaces within the interconnects.

Prior to the present invention, an inert gas plasma, such as an Argon (Ar) plasma, physically cleaned the surfaces of interconnects and metal layers, such as aluminum and copper, as ions were attracted to the substrate surface to physically bombard the surface and remove the surface of the uppermost layer. However, the Ar ions in the plasma depend on directionality to clean and with the decreasing sizes of the interconnects, the increasing aspect ratios, and the resulting shading that can occur, this process is ineffective in removing oxides in the small features.

Therefore, there is a need for an improved cleaning process to reduce oxides formed on the surface of substrates and materials deposited thereon.

SUMMARY OF THE INVENTION

The present invention provides a process for removing oxides and other contaminants comprising initiating a plasma containing a reducing agent in a chamber and exposing at least a portion of a substrate surface having a reducible contaminant to the reducing agent. In a preferred embodiment, the reducing agent comprises a compound containing nitrogen and hydrogen, preferably ammonia. One example may include introducing a reducing agent comprising nitrogen and hydrogen into a chamber, initiating a plasma in the chamber, and exposing an oxide to the reducing agent. The plasma process parameters to reduce an oxide, such as copper oxide, using ammonia include a pressure range of about 1 to about 9 mTorr, an RF power of about 100 to about 1000 watts for a 200 mm wafer to the chamber with a power density of about 1.43 to 14.3 watts/cm$^2$, a substrate temperature of about 100° to about 450° C., a showerhead to substrate spacing of about 200 to about 600 mils, and a reducing agent flow rate of about 100 to about 1000 sccm.

An exemplary process sequence of the invention, such as for forming a dual damascene structure, includes depositing a dielectric on a substrate, depositing an etch stop, etching the etch stop, depositing a barrier layer, depositing a metal layer, initiating a reducing agent plasma, reducing oxides which may form on at least some of the metal surface with the reducing agent, such as ammonia, and in situ depositing a layer, such as a nitride layer, over the reduced surface.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention provides a process for removing oxides and other contaminants comprising initiating a plasma containing a reducing agent and exposing at least a portion of a substrate surface having a reducible contaminant to the plasma and the reducing agent. The reducing process is believed to increase the adhesion of the adjoining layer and to decrease the electrical resistance of the combined layers by decreasing the oxygen content in the oxidized layer. At least in part, these adverse oxide effects are believed to be due to the metal oxides, such as copper oxide ($Cu_2O$), reducing the mobility of the metal, e.g., copper (Cu). In the preferred embodiment, the process is performed in situ to minimize re-contamination before the deposition of a subsequent layer. In situ processing may be particularly important with copper, because of its rapid susceptibility to oxidation.

In an integrated circuit (IC) fabrication, a metal layer is deposited at some point in the deposition process and typically comprises aluminum or copper. Because copper is being considered for the conducting material, much of the discussion herein is addressed to copper. However, the present invention may be used for any oxidized metal layers, such as Ti, TiN, Ta, TaN, Al, and others. It may also be used for other layers, including silicon oxides. The present invention combines the chemical reactive cleaning of a reducing agent, such as a compound containing nitrogen and hydrogen, including ammonia, with the physical bombardment of the ions from a plasma, and so may be used on a variety of materials to effectuate the reduction of contaminants, such as oxides. While oxides are clearly discussed in the specification, other contaminants would fall within the scope of the present invention. It is believed that the nitrogen combined with hydrogen allows a reduced energy level to break the hydrogen bonds and otherwise disassociate the molecules and more effectively utilize the reducing agent to clean the contaminants.

Before depositing a layer over the metal, such as a nitride, the metal is cleaned according to the teaching of the present invention. By "cleaning", the term is meant to include a reduction of an oxide or other contaminants. Cleaning may be necessary due to exposure to an oxygen source (such as air, diatomic oxygen, or oxygen contained in a molecular compound). This cleaning may take place in the same CVD or plasma enhanced chemical vapor deposition ("PECVD") chamber in which the subsequent layer is deposited, as an in situ process. The term "in situ" is intended to include in a given chamber, such as in a plasma chamber, or in a system, such as an integrated cluster tool arrangement, without exposing the material to intervening contamination environments. An in situ process typically minimizes process time and possible contaminants compared to relocating the substrate to other processing chambers or areas.

In one embodiment, the reduction process typically includes introducing the reducing agent, such as ammonia, into a vacuum chamber and initiating a plasma where the plasma excites the ammonia into an energized ionic state. The energized ions chemically react with the oxide and the oxides are removed according to the following equation:

$$3Cu_2O+2NH_3 \rightarrow 6Cu+3 H_2O+N_2$$

The plasma provides the energy necessary to disassociate the ammonia and to provide the desired ion bombardment. The ionized particles impact the oxidized surfaces in the reduction process to further enhance the cleaning. The combination of chemical reactions and physical bombardment of ions increases the likelihood that all surfaces in small features are cleaned or oxides reduced.

The process of the invention is believed to afford at least two advantages. First, the cleaned surface is better prepared for increased adhesion to an adjoining layer. Removal of the oxide allows a better bond to the base conducting material. Secondly, oxides are known to increase resistance of a layer or combined layers. Thus, the reduction of the oxide decreases the resistance or impedance of the combined layers.

The plasma process parameters for at least one embodiment, using ammonia to reduce the copper oxide, include a pressure range of about 1 to about 9 mTorr, an RF power of about 100 to about 1000 watts to a chamber, that may have a reaction zone, to create the plasma having a power density of about 1.43 to about 14.3 watts/cm$^2$, a substrate surface temperature of about 100° to about 450° C., a showerhead to substrate spacing of about 200 to about 600 mils, and a reducing agent flowing at a rate of about 100 to about 1000 sccm into the chamber. The gas dispersion element, such as a "showerhead", is commonly known to those with ordinary skill in the art and is used interchangeably herein, and includes other gas dispersion elements. The "reaction zone" is the zone between the showerhead and the substrate surface in the chamber, such as one in a CENTURA DxZ™ CVD reactor, fabricated and sold by Applied Materials, Inc. of Santa Clara, Calif.

A preferred process range includes a pressure range of about 3 to about 7 mTorr, an RF power of about 100 to about 500 watts for a 200 mm wafer having a power density of about 1.43 to about 7.14 watts/cm$^2$, a substrate temperature of about 200° to about 400° C., a showerhead to substrate spacing of about 200 to about 500 mils, and a reducing agent flowing at a rate of about 100 to about 500 sccm. A most preferred process range includes a pressure range of about 4 to about 6 mTorr, an RF power of about 200 to about 400 watts having a power density of about 2.86 to about 5.72 watts/cm$^2$, a substrate temperature of about 300° to about 400° C., a showerhead to substrate spacing of about 300 to about 400 mils, and a reducing agent flowing at a rate of about 200 to about 300 sccm. Additionally, carrier gases may be used in conjunction with the above process parameters to assist in stabilizing the gas flow and the plasma reaction. The flow rate of the carrier gases, such as helium, argon, and nitrogen, could be approximately 0 to 2000 sccm.

The plasma reducing process reduces, treats, or otherwise modifies the surface in about 5 to about 60 seconds. Preferably, the ammonia plasma is generated in one or more treatment cycles and purged between cycles. However, in most cases, one treatment cycle lasting 10 seconds effectively removes oxygen from an oxidized copper surface. Naturally, the parameters could be adjusted for other materials besides copper and other contaminants besides oxides.

Figure 2:
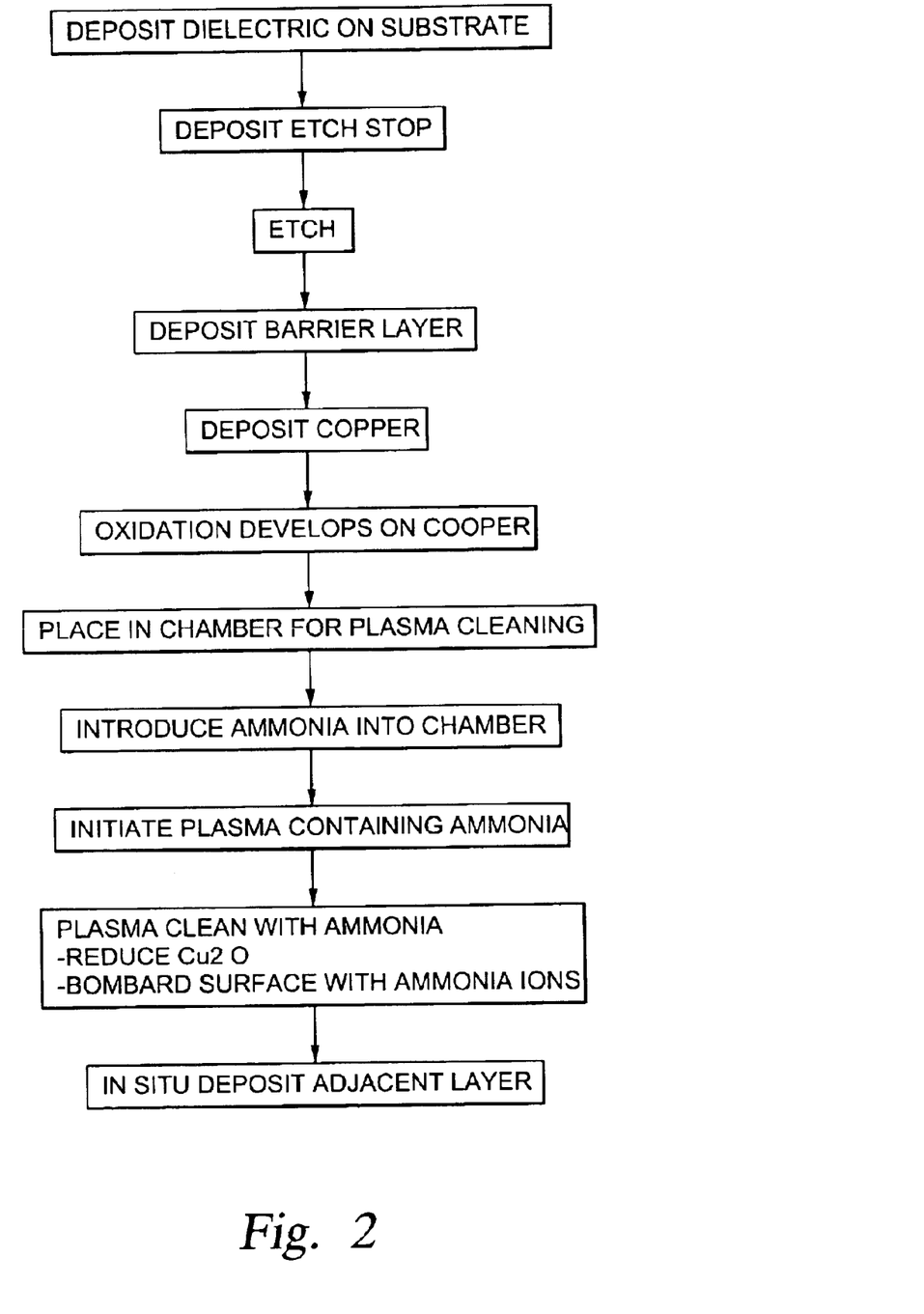
FIG. 2 is a flow chart of one example of a deposition/etching process using the plasma reducing process.

FIG. 2 shows a deposition/plasma reducing sequence of one example of the present invention. Other sequences, fabrication techniques, and processes may be used. Typically, a dielectric such as silicon dioxide, silicon nitride, or silicon carbide is deposited on a substrate. The term "substrate" herein includes the IC base or the IC including deposited materials or levels thereon, as the context may indicate. An etch stop is deposited over the dielectric and interconnects are etched therethrough to form a pattern. Horizontal interconnects are typically referred to as lines and vertical interconnects are typically referred to as contacts or vias; contacts extend to a device on the underlying substrate, while vias extend to an underlying metal layer, such as M1, M2, etc. Once the lines and contacts/vias are patterned, such as shown in FIG. 1, a barrier layer, such as a TiN layer, is deposited over the pattern to restrict the diffusion of the conductor into the dielectric layer(s). The conducting material may then be deposited over the barrier layer. An oxidation may form on the conducting material, impeding adhesion and conductance. The substrate may be placed in a processing chamber for plasma cleaning that may be in situ with prior or subsequent processes. Typically, the system would initiate a plasma and introduce a reducing agent into the chamber, whereupon the plasma cleaning would occur. The plasma would assist in energizing the reducing agent molecules to clean and otherwise reduce the oxide.

After the conductor is cleaned, another layer, such as a nitride, may be in situ deposited over the conductor to reduce further contamination from an adverse environment, such as one with oxygen. Typically, this layer is a dielectric layer, but can include other types of layers, such as a barrier layer, an etch stop, or a passivation layer. Alternatively, the reduced substrate may be transported to a different chamber for subsequent processing. The cleaning is not restricted to the conductor—other layers before and after the conductor layer could be plasma cleaned using the underlying concepts of the present invention.

EXAMPLE 1

Without an Ammonia Plasma Reducing Process

Figure 3:
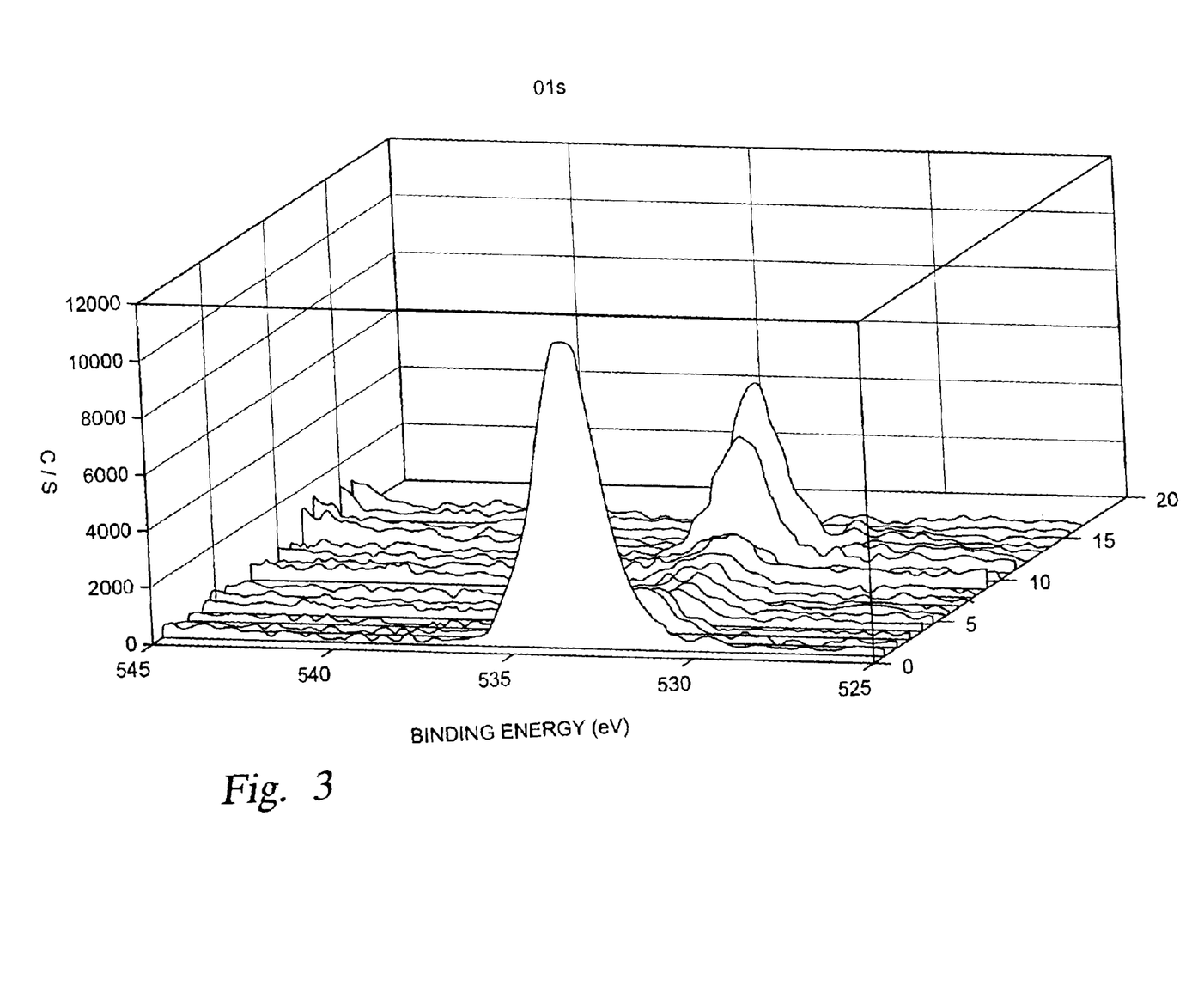
FIG. 3 is a graph of dielectric compatibility showing oxygen levels obtained from a copper wafer after a CMP process.

FIG. 3 shows the oxygen detected through a 500 Å nitride layer deposited on a copper surface after a CMP process without a plasma reducing process. The x-axis represents the binding energy in electron volts (ev), the y-axis represents counts per signal (c/s), and the z-axis represents a relative depth profile through the nitride film layer. The x-axis, showing the binding energy, is element specific and the substrate layers have been tested at an oxygen binding energy level to detect its presence. The y-axis represents the oxygen level detected at an oxygen-specific binding energy. Because the z-axis is relative, the distance between the two largest peaks along the z-axis is the approximate thickness of the 500 Å nitride layer. Beyond the 500 Å nitride layer, the signal count drops to approximately zero because copper is a conductor. FIG. 3 shows a first high peak closest to the origin of the z-axis of ~11000 c/s. This first and highest peak represents the surface of the nitride layer and may be ignored for the present purposes. The last large peak at a depth of ~500 Å represents the oxygen level of ~6000 c/s at the nitride/copper interface. This interface has a quantity of copper oxide that has not been reduced in accordance with the teaching of the present invention.

EXAMPLE 2

With an Ammonia Plasma Reducing Process

Figure 4:
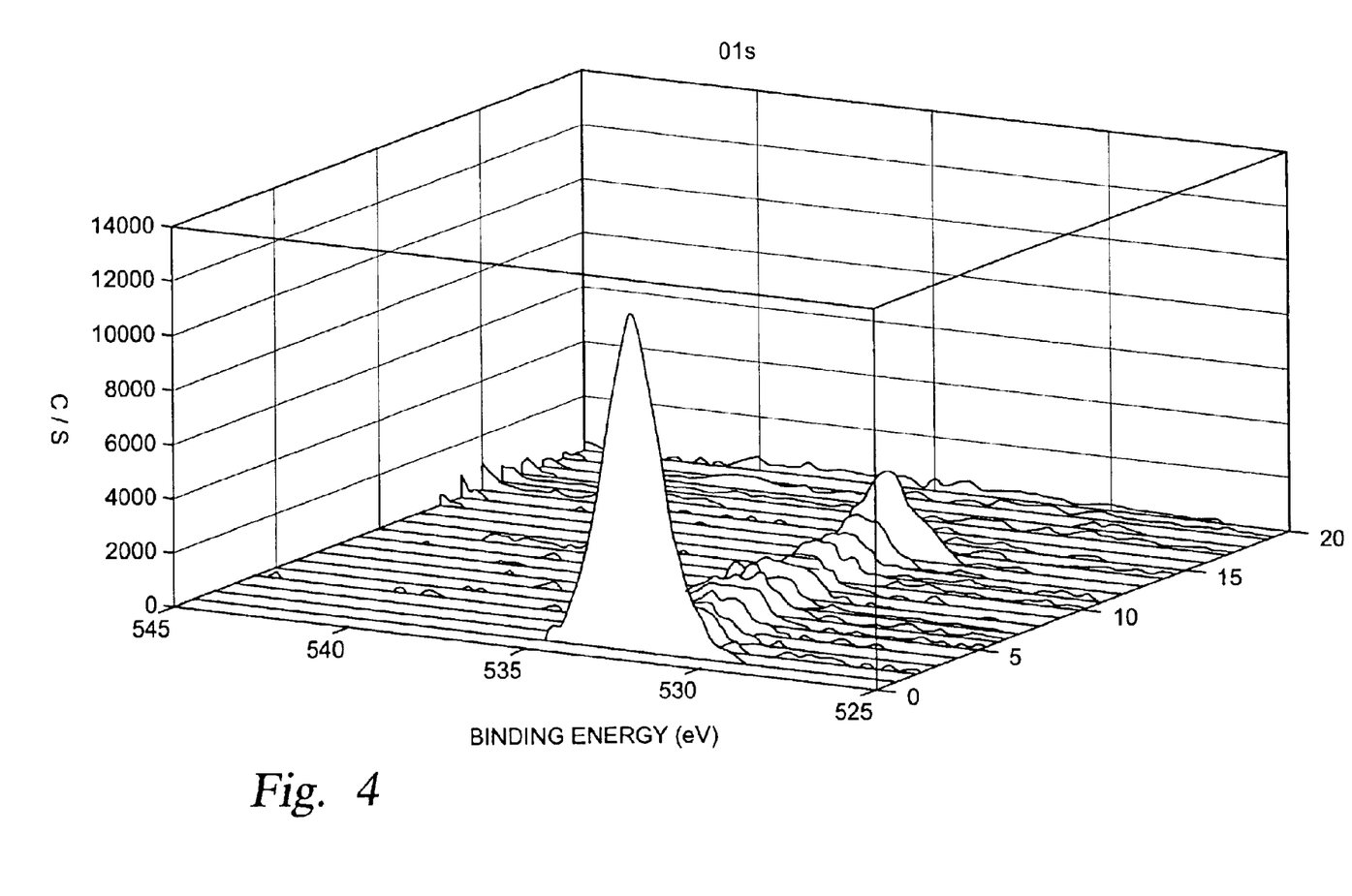
FIG. 4 is a graph in comparison to FIG. 3 showing an improvement by the plasma reducing process of the present invention, having decreased oxygen levels.

FIG. 4 is a graph corresponding to FIG. 3, showing the results from an exemplary copper surface substrate treated by an ammonia plasma reducing process of the present invention. FIG. 4 can be compared to FIG. 3 and the axes represent similar scales and values. Similar to the substrate surface of FIG. 3, a 500 Å nitride layer was deposited on the copper after applying the plasma reducing process of the present invention. FIG. 4 shows an overall lower oxygen level beyond the initial surface peak, where the initial surface peak may again be ignored for the present purposes. Noticeably, the oxygen level at the nitride/copper interface, represented by the second peak at a depth of about 500 Å, has been lowered to a level of ~3000 c/s due to the elimination or reduction of the oxide from the copper surface.

Figure 5:
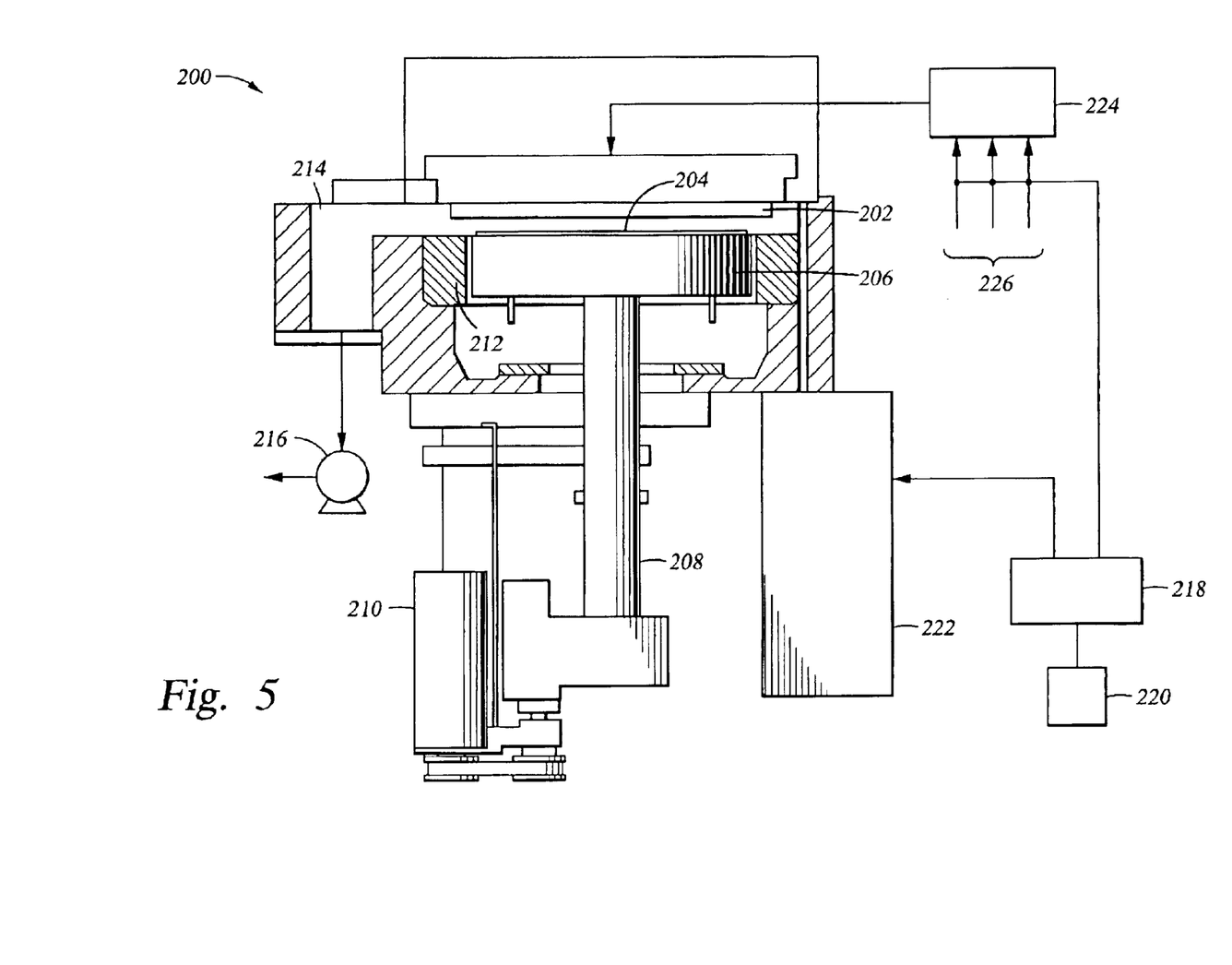
FIG. 5 shows a cross-sectional view of one commercially available CVD plasma reactor in which the plasma reducing process of the present invention may be performed.

FIG. 5 is a cross-sectional view of a CVD plasma reactor in which the above plasma reducing process may be performed, such as a CENTURA DxZ™ mentioned above. The present invention could be used in other reactors, such as a lamp heated reactor. Reactor 10 contains a gas distribution manifold 11, which may be the above described showerhead, for dispersing process gases through perforated holes (not shown) in the manifold to a substrate or wafer 16 that rests on a substrate support plate or susceptor 12. Susceptor 12 is resistivity heated and is mounted on a support stem 13, so that susceptor 12 and the wafer supported on the upper surface of susceptor 12 can be controllably moved by a lift motor 14 between a lower loading/off-loading position and an upper processing position, which is spaced closely adjacent to the manifold 11. When susceptor 12 and the wafer 16 are in the processing position, they are surrounded by an insulator ring 17. During processing, gases inlet to manifold 11 are uniformly distributed radially across the substrate surface. The gases exhaust through a port 24 by a vacuum pump system 32.

The deposition process performed in reactor 10 can be either a thermal process or a plasma enhanced process. In a plasma process, a controlled plasma is formed adjacent to the wafer by RF energy applied to distribution manifold 11 from RF power supply 25 with susceptor 12 grounded. Gas distribution manifold 11 is also an RF electrode, while susceptor 12 is grounded. RF power supply 25 can supply either single or mixed frequency RF power to manifold 11 to enhance the decomposition of any reactive species introduced into chamber 15. A mixed frequency RF power supply typically supplies power at a high RF frequency (RF1) of 13.56 MHz and at a low RF frequency (RF2) of 350 kHz. The system controller 34 and memory 38 control the activities of the CVD reactor. An example of such a CVD reactor is described in U.S. Pat. No. 5,000,113, which is incorporated by reference and entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

With the present invention, the above chamber can be used to plasma reduce an oxide with a reducing agent and particularly a copper oxide with ammonia. The reducing agent can be introduced through manifold 11 and be uniformly distributed radially across the wafer surface for the plasma reducing process in the manner described above, followed by the gases exhausting through the port 24.

The above discussion applies in general to the improvement provided by the plasma reducing process and can be used in multiple environments, on substrates, and in a variety of processes. This plasma reducing process has particular applicability to the increased density and complexity of a dual damascene structure. The following discussion briefly discusses aspects from a dual damascene structure and how the plasma reducing process may be utilized.

Figure 6:
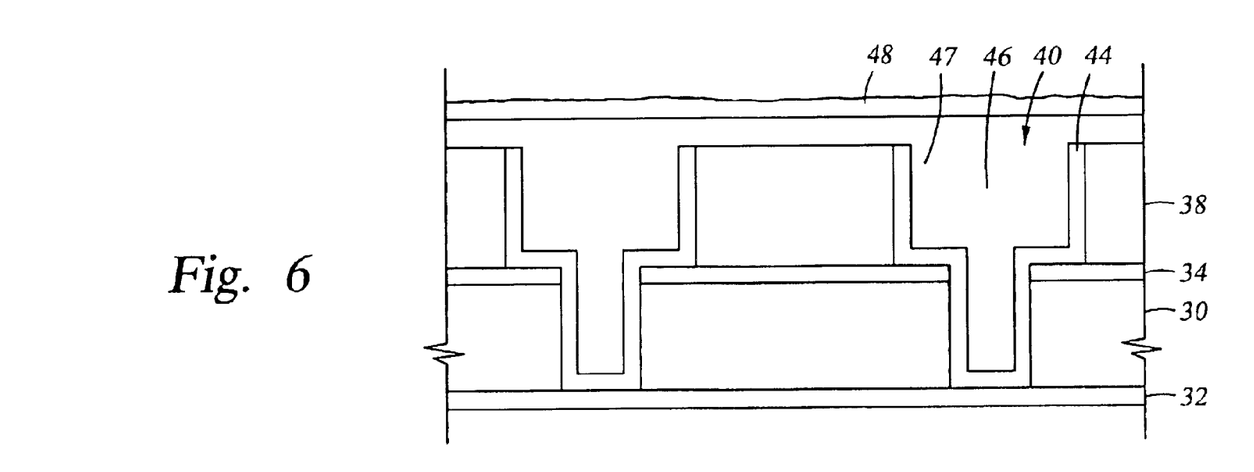
FIG. 6 is a dual damascene structure showing an oxide layer on a conductor.
Figure 7:
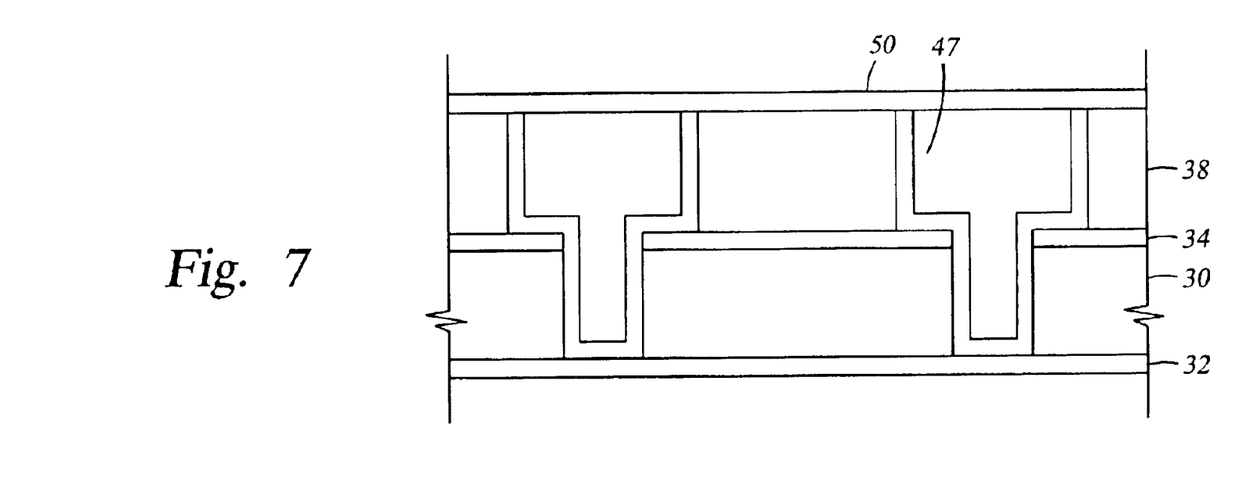
FIG. 7 is a dual damascene structure with a layer deposited on the cleaned conductor.

FIGS. 6 and 7 represent a dual damascene structure which can be cleaned using the techniques of the present invention. In forming one type of dual damascene structure, a first dielectric layer 30 is deposited on a substrate 32, followed by an etch stop 34 deposition. The etch stop is pattern etched to define contact/via openings 40 and to expose the first dielectric layer in the areas where the contacts/vias are to be formed. A second dielectric layer 38 is deposited over the etch stop and patterned to define interconnect lines, preferably using conventional photolithography processes with a photoresist layer, as would be known to those with ordinary skill in the art. The interconnects and contacts/vias are then etched using reactive ion etching or other anisotropic etching techniques and any photoresist or other material used to pattern the layers is removed using an oxygen strip or other suitable process. A barrier layer 44 is then preferably deposited conformally in the metallization pattern to prevent metal migration into the surrounding silicon and/or dielectric material.

With the present invention, the above plasma reducing process may be useful on the barrier layer or other layers deposited prior or subsequent to the metal layer. The regime and parameters discussed above for the plasma reduction of the conductor could be adjusted for the particular layer in question.

The metal layer 47 is deposited in the vias and lines and is preferably a conductive material such as aluminum, copper, tungsten or combinations thereof with the recent trend being copper. The metal layer is deposited using either CVD, PVD, electroplating, or combinations thereof to form the conductive structure. Once the structure has been filled with copper or other metal, a CMP process may be used to planarize the metal surface. In other embodiments, a sacrificial layer may be deposited on the field areas between the interconnects prior to the metal deposition, and then the sacrificial layer stripped after the metal is deposited, leaving a surface suitable for the next stage of the deposition process. The structure surface may be planarized, using a CMP process at this stage and/or at other stages. The above plasma reducing process may be initiated to remove or reduce a contaminant layer 48, such as copper oxide, that may have formed on the metal layer 47, including the interconnects 46. In the preferred embodiment, the plasma reducing process is applied in situ with the deposit of the adjoining layer 50, shown in FIG. 7. This layer may be another dielectric layer, a barrier layer, a passivation layer, or some other layer beside the metal layer.

Specifically, the process steps could include: depositing a first dielectric layer, such as a fluorinated silicate glass (FSG) layer, on a substrate, depositing a low k dielectric etch stop on the first dielectric layer, patterning the etch stops to define the contacts/vias, stripping the patterning medium such as a photoresist layer, depositing a second dielectric layer, such as an FSG layer, and patterning a resist layer on the second dielectric layer to define one or more interconnects. Once the dual damascene structure has been formed, the process can include: depositing a barrier layer in the structure, depositing a metal layer such as copper, and exposing an oxidized surface of the metal layer to a plasma with the reducing agent to reduce the oxide. Another layer, such as a nitride, may then be deposited over the surface in situ with the reducing process.

While the foregoing is directed to the preferred embodiment of the present invention, other and further embodiments of the invention may be devised without departing from the basis scope thereof, and the scope thereof is determined by the claims that follow. Furthermore, in this specification, including particularly the claims, the use of "comprising" with "a" or "the", and variations thereof means that the item(s) or list(s) referenced includes at least the enumerated item(s) or list(s) and furthermore may include a plurality of the enumerated item(s) or list(s), unless otherwise stated.

What is claimed is:

1. A method for reducing oxidation of an interface of a semiconductor device, said semiconductor device having at least a first layer comprising silicon carbide and a second layer wherein the interface is disposed between said first and second layers, the method comprising the steps of:
    (a) providing said first layer having a partially oxidized interface;
    (b) introducing a hydrogen-containing plasma to said interface;
    (c) chemically reducing the oxidized portion of the interface; and
    (d) introducing second-layer-forming materials to said hydrogen-containing plasma.

2. The method of claim 1 wherein the second layer comprises at least one layer selected from the group consisting of a patterned etch stop layer, a barrier layer, and a film comprising silicon carbide.

3. The method of claim 1 wherein the first layer further comprises at least one conductive device disposed therein.

4. The method of claim 3 wherein the at least one conductive device is formed from at least one of copper, titanium, tantalum, and tungsten.

5. The method of claim 1 wherein the hydrogen-containing plasma further comprises ammonia.

6. The method of claim 1 wherein the hydrogen-containing plasma further comprises silane.

7. A method for reducing oxidation of an interface of a semiconductor device, said semiconductor device having at least a first layer comprising silicon carbide and having one or more conductive material devices disposed therein and a second layer wherein the interface is disposed between said first and second layers, the method comprising the steps of:
    (a) providing said first layer having oxidized conductive material at said interface;
    (b) introducing an ammonia/nitrogen plasma to said interface; and
    (c) introducing silane to said ammonia/nitrogen plasma.

8. The method of claim 7 wherein the second layer comprises at least one layer selected from the group consisting of a patterned etch stop layer, a barrier layer, and a film comprising silicon carbide.

9. A method of removing a contaminant from one or more conductive pathways disposed in a layer comprising silicon carbide on a substrate, comprising:

(a) introducing a reducing agent comprising nitrogen and hydrogen into a process chamber;
(b) initiating a plasma of the reducing agent in the process chamber; and
(c) exposing the contaminant to the plasma of reducing agent.

10. The method of claim 9 further comprising:
depositing in-situ a silicon carbide film after the exposing step without breaking vacuum in the process chamber.

11. The method of claim 9 wherein the contaminant comprises oxide of at least one material contained in at least one layer that has been formed on the substrate or contained in reactants used to form the at least one layer.

12. The method of claim 9 wherein the reducing agent further comprises ammonia.

13. The method of claim 9 wherein the reducing agent comprises silane.

* * * * *

UNITED STATES PATENT AND TRADEMARK OFFICE
CERTIFICATE OF CORRECTION

PATENT NO. : 6,946,401 B2
DATED : September 20, 2005
INVENTOR(S) : Huang et al.

It is certified that error appears in the above-identified patent and that said Letters Patent is hereby corrected as shown below:

Title page,
Item [56], References Cited, U.S. PATENT DOCUMENTS, after "6,355,571 B1" insert -- * --.
FOREIGN PATENT DOCUMENTS, "JP 11-016912" reference, delete "21/305" and insert -- 21/3205 --.

Signed and Sealed this

Twenty-fourth Day of January, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,946,401 B2 | Page 1 of 1 |
| APPLICATION NO. | : 10/655438 | |
| DATED | : September 20, 2005 | |
| INVENTOR(S) | : Huang et al. | |

It is certified that error appears in the above-identified patent and that said Letters Patent is hereby corrected as shown below:

On page 2, in field (56), under "U.S. Patent Documents", in column 1, line 33, below "6,365,527 B1" insert -- 6,700,202 B2    *    3/2004 Huang et al.    257/762 --.

Signed and Sealed this

Twelfth Day of December, 2006

JON W. DUDAS
*Director of the United States Patent and Trademark Office*